United States Patent
Veches et al.

(10) Patent No.: US 11,664,084 B2
(45) Date of Patent: May 30, 2023

(54) MEMORY DEVICE ON-DIE ECC DATA

(71) Applicant: Micron Technology, Inc., Boise, ID (US)

(72) Inventors: Anthony D. Veches, Boise, ID (US); Randall J. Rooney, Boise, ID (US); Debra M. Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/391,830

(22) Filed: Aug. 2, 2021

(65) Prior Publication Data

US 2023/0031842 A1 Feb. 2, 2023

(51) Int. Cl.
*G11C 29/42* (2006.01)
*G11C 29/18* (2006.01)
*G11C 29/14* (2006.01)
*G11C 29/44* (2006.01)
*G06F 11/07* (2006.01)
*G06F 11/10* (2006.01)

(52) U.S. Cl.
CPC .......... *G11C 29/42* (2013.01); *G06F 11/0754* (2013.01); *G06F 11/106* (2013.01); *G11C 29/14* (2013.01); *G11C 29/18* (2013.01); *G11C 29/4401* (2013.01)

(58) Field of Classification Search
CPC ......... G11C 29/42; G11C 29/14; G11C 29/18; G11C 29/4401; G06F 11/0754; G06F 11/106
See application file for complete search history.

(56) References Cited

U.S. PATENT DOCUMENTS

| | | | |
|---|---|---|---|
| 4,881,232 A | 11/1989 | Sako et al. | |
| 7,478,306 B2 | 1/2009 | Okamoto et al. | |
| 10,599,504 B1 | 3/2020 | BeSerra et al. | |
| 2003/0126544 A1 | 7/2003 | Dadurian | |
| 2008/0215954 A1* | 9/2008 | Oshikiri | G06F 11/1068 714/764 |
| 2008/0239808 A1* | 10/2008 | Lin | G11C 16/3431 365/222 |
| 2013/0326293 A1* | 12/2013 | Muralimanohar | G11C 29/56008 714/E11.159 |
| 2015/0074476 A1* | 3/2015 | Kim | G11C 29/44 714/723 |
| 2016/0098216 A1 | 4/2016 | Huang et al. | |
| 2017/0060681 A1* | 3/2017 | Halbert | G06F 3/064 |
| 2019/0060681 A1 | 2/2019 | White | |
| 2020/0066329 A1 | 2/2020 | Son | |
| 2020/0387323 A1 | 12/2020 | Boehm et al. | |

* cited by examiner

*Primary Examiner* — Thien Nguyen
(74) *Attorney, Agent, or Firm* — Brooks, Cameron & Huebsch, PLLC

(57) ABSTRACT

Methods, devices, and systems related to memory device on-die ECC data are described. In an example, a scrub operation can be performed on data in order to determine which rows of memory cells in an array include a particular number of errors. The particular number of errors can be a number of errors that exceed a threshold number of errors. An address of the determined rows with the particular number of errors can be stored in memory cells of the array for later access. The address of the determined rows can be accessed to perform a user-initiated repair operation, a self-repair operation, a refresh operation, and/or to alter timing of access of the cells or alter voltage of the cells.

19 Claims, 5 Drawing Sheets

MEMORY DEVICE ON-DIE ECC DATA

TECHNICAL FIELD

The present disclosure relates generally to memory device on-die error correction code (ECC) data.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), DRAM, and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be used as main memory in computing systems.

DETAILED DESCRIPTION

Figure 1:
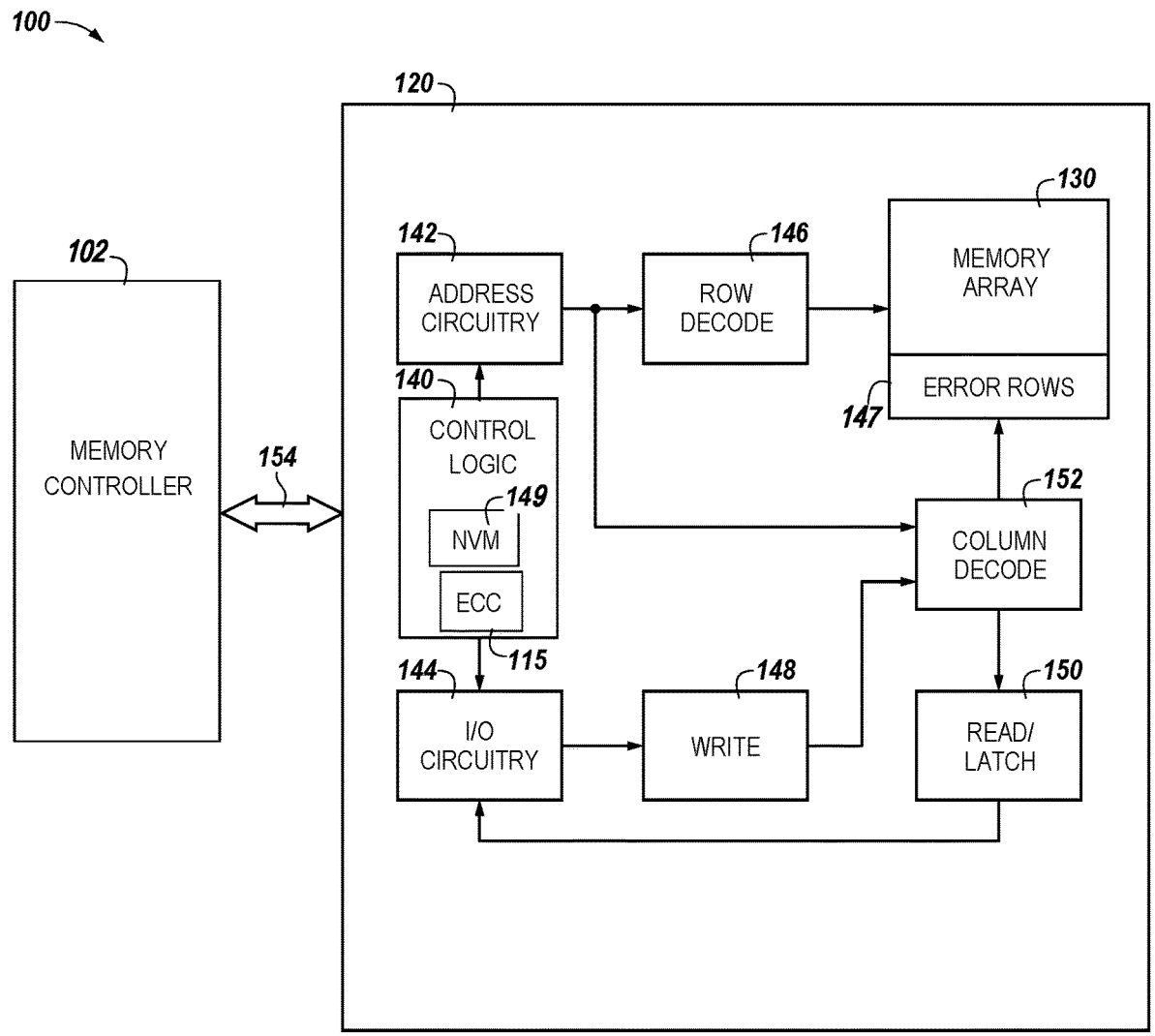
FIG. 1 is a block diagram of an apparatus in the form of a computing system including a memory system in accordance with a number of embodiments of the present disclosure.

The present disclosure relates to methods, devices, and systems related to memory device on-die ECC data are described. In an example, a scrub operation can be performed on data in order to determine which rows of memory cells in an array include a particular quantity (or number) of errors. The particular number of errors can be a quantity of errors that exceeds a threshold quantity of errors. An address indicating an address (or location) of the determined rows with the particular quantity of errors can be stored in a memory device for later access, such as in registers of the memory device. The address of the determined rows can be accessed to perform a user-initiated repair operation, a self-repair operation, a refresh operation, and/or to alter timing of access of the cells or alter voltage of the cells.

As DRAM memories are accessed a high number of times, the memory cells storing the data may experience failures due to these repeated accesses to a particular row of memory cells (e.g., cells coupled to an access line). These intermittent failures caused by errors in the data can affect reading of the data and can be reduced by repairing the data, reading and writing the data additional times beyond the normal memory refreshes, altering timing and/or voltage associated with the memory cells, etc. The quantity of errors in a row of memory cells can be determined by performing an error correction code (ECC) operation. The quantity of errors can be stored in a memory device. By doing so, the rows of memory cells that are experiencing errors, or the data stored in those rows of memory cells that include the errors, can be located within the memory device without receiving data external to the memory device to indicate which rows to repair, increase refreshing, alter timing on and/or alter voltage on, etc. The error correction performed on the data can reduce the bit error rates (BER) and increase reliability of the data.

A memory refresh refers to a process of periodically reading data stored in a memory and immediately rewriting the data back to the memory without modification, for the purpose of preserving the data. In a Dynamic Random Access Memory (DRAM) device (e.g., chip), each bit of memory is stored as an electric charge on a small capacitor of a memory cell. As time passes, the charge stored on the capacitor can leak if not refreshed at particular time intervals. The data could be eventually lost absent a memory refresh. During the memory refresh, circuitry can periodically cause reading of each memory cell and rewriting of the data of the memory cell back to the memory cell, restoring the charge on the capacitor of the memory cell back to its original level. The memory refresh can be performed automatically, in the background, while the DRAM is in an operating mode.

A memory refresh occurs outside of the normal memory operations (e.g., read and write cycles) used to access data. Instead, specialized cycles referred to as refresh cycles are generated by separate counter circuits and interspersed between normal memory accesses. A refresh cycle is similar to a normal read cycle but differs in two important ways. First, a refresh uses only a row address so the column address is not necessary. Second, data read from the cells during a memory refresh is not sent through output buffers and/or on a data bus to a host (e.g., a memory controller, external host processor, etc.). For example, data stored in a memory array can be read from the cells into a corresponding sense amplifier and then stored back into the cells, and thereby refresh the original data values to a full state.

By performing these methods on memory cells that store data with a threshold quantity (or number) of errors, the quantity of errors in the data stored in the memory cells can be maintained below a level at which the memory can no longer be corrected. For example, error correction methods and/or systems can be limited to a number of correctable bits and/or portions of data that the method or system can correct. Once the memory array exceeds these limits, the memory array may become uncorrectable. By maintaining error rates below a threshold, the memory array remains correctable.

An ECC operation can include generating parity data, for example, by performing an XOR and/or RAID operation, on data stored in memory cells of the array. The parity data can be stored in (e.g., written to) the DRAM device and/or in the non-volatile memory device with the data. In some examples, the parity data can be embedded in the data in a volatile memory device and/or a non-volatile memory device.

Data stored in the volatile and/or non-volatile memory device can be reconstructed using the parity data. A controller can receive (e.g., read) the parity data from the DRAM memory device and reconstruct the data in response to a read failure. The read failure can be due to corrupted memory in the DRAM memory device. In some examples, the controller can read and reconstruct the data in one clock cycle since the parity data is readily available at the DRAM memory device.

In a number of embodiments, the parity data can be stored in non-volatile memory in the memory device prior to powering off the memory (or DRAM) device. The parity data can be rewritten to the array of memory cells (e.g., volatile memory cells) of the DRAM device in response to powering on the DRAM device. In some examples, the parity data can be regenerated at the controller and/or received at the DRAM device in response to powering off and powering on the DRAM device. For example, the controller can receive the user data from the non-volatile memory device and perform an XOR operation on the user data in response to powering on the DRAM device and/or the DIMM.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "M", "N", "X", and "Y" indicates that a number of the particular feature so designated can be included with a number of embodiments of the present disclosure.

As used herein, "a number of" something can refer to one or more of such things. For example, a number of DIMMs can refer to one or more DIMMs. Additionally, designators such as "M", "N", "X", and "Y", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 120 in accordance with a number of embodiments of the present disclosure. As used herein, a memory device 120, a memory array 130, and/or a logic 140 (e.g., control logic), and/or read/latch circuitry 150 might also be separately considered an "apparatus."

System 100 includes a memory controller 102 coupled (e.g., connected) to memory device 120, which includes a memory array 130. An example of memory device 120 includes a DRAM device. In a number of embodiments, the DRAM device includes an on-die ECC capability which is performed by an error correction code (ECC) component 115 of the memory device 120. The ECC component 115 can include error correction circuitry and/or components to perform a number of error corrections. An ECC engine (not illustrated) can be coupled to the memory array 130 that corrects errors as the data is read out from the memory array 130 through output buffers.

The memory controller 102 can be coupled to a host (not illustrated). The host can be a host system such as a personal laptop computer, a desktop computer, a digital camera, a smart phone, or a memory card reader, among various other types of hosts. The host can include a host controller that is external to the memory device 120. The host controller can include control circuitry, e.g., hardware, firmware, and/or software. In one or more embodiments, the host controller can be an application specific integrated circuit (ASIC) coupled to a printed circuit board including a physical interface. The host can include a system motherboard and/or backplane and can include a number of processing resources (e.g., one or more processors, microprocessors, or some other type of controlling circuitry).

The system 100 can include separate integrated circuits or both the host 110 and the memory device 120 can be on the same integrated circuit. For instance, the system 100 can be a hybrid memory cube (HMC) where control components (e.g., control circuitry or control logic 140) can be located on a logic die and memory components can be located in a number of stacked dies.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells).

The memory device 120 can include a controller 123 that can include control circuitry, e.g., hardware, firmware, and/or software. In one or more embodiments, the controller 123 can be an application specific integrated circuit (ASIC) coupled to a printed circuit board including a physical interface. In some embodiments, the controller 123 can be a media controller such as a DRAM memory controller or a non-volatile memory express (NVMe) controller. For example, the controller 123 can be configured to perform operations such as copy, write, read, error correct, etc. for the memory device 130. In addition, the controller 123 can include special purpose circuitry and/or instructions to perform various operations described herein. That is, in some embodiments, the controller 123 can include circuitry and/or instructions that can be executed to store an address (or location) of a row of memory cells that include a particular quantity (or number) of errors. In some embodiments, circuitry and/or instructions provided to the controller 123 can control performing a repair operation on the rows of memory cells that have the particular quantity of errors.

The memory array 130 can include additional rows or registers (e.g., "ERROR ROWS") 147 for storing an address of a particular row of memory cells. The particular row of memory cells can be associated with rows of memory cells that include a quantity of errors that exceed a threshold quantity of errors. As an example, an ECC operation can be performed and can indicate a quantity of errors within data that is stored in memory cells of a particular row. The address of that particular row can be stored in the additional rows 147 for subsequent access. In response to a message from a host to perform a repair operation, the address of that particular row can be accessed in the additional rows 147 and the data in the memory cells in the row at that address can be repaired. Further, the particular addresses of the rows can be added into a list for performing refresh operations and the particular rows can be refreshed at a rate greater than a rate of refresh operations on rows that are not stored at the addresses in the additional rows 147, as will be described further below in association with FIG. 2.

The memory device 120 includes address circuitry 142 to latch address signals provided over bus 154 (e.g., a data bus) through I/O circuitry 144. Address signals may also be sent by memory controller 102 and received to control logic 140 (e.g., via address circuitry 142 and/or via bus 154). Address signals are received and decoded by a row decoder 146 and a column decoder 152 to access the memory array 130. Data can be read from memory array 130 by sensing voltage and/or current changes on the data lines using read/latch circuitry 150. The read/latch circuitry 150 can read and latch a page (e.g., row) of data from the memory array 130. The I/O circuitry 144 can be used for bi-directional data communication with host 110 over the bus 154. The write circuitry 148 is used to write data to the memory array 130. The control logic 140 includes non-volatile memory ("NVM") 149 that can be used to store data in the event of a power down or a power cycle of the memory device 120. For example, the data stored in the additional rows 147 can be written to the non-volatile memory 149 prior to a power cycle event and the data can be maintained during that power cycle event. While the example illustrates the non-volatile memory 149 within the control logic 140, examples are not so limited. The non-volatile memory 149 can be located in other addresses within the memory device 120. In another such example, the non-volatile memory 149 can be stored in a portion of the memory array 130.

Control logic 140 decodes signals provided by memory controller 102 through bus 154. While bus 154 is illustrated as a single bus sending address signals, bi-directional communication, decode signals etc., embodiments are not so limited. For example, the bus 154 can be separated into more than one bus where each bus is designated for particular signals (e.g., a bus for address signals and/or commands, a bus for bi-directional communication, etc.). These signals can include chip enable signals, write enable signals, and address latch signals that are used to control operations performed on the memory array 130, including data read, data write, and data erase operations. In various embodiments, the logic 140 is responsible for executing instructions from the host 110. The logic 140 can be a state machine, a sequencer, or some other type of control circuitry. Logic 140 can be implemented in hardware, firmware, and/or software. While the logic 140 is illustrated as coupled to particular components (e.g., coupled to memory array 130 and address circuitry 142), the controller can be coupled to any of the components within memory device 120.

Figure 2:
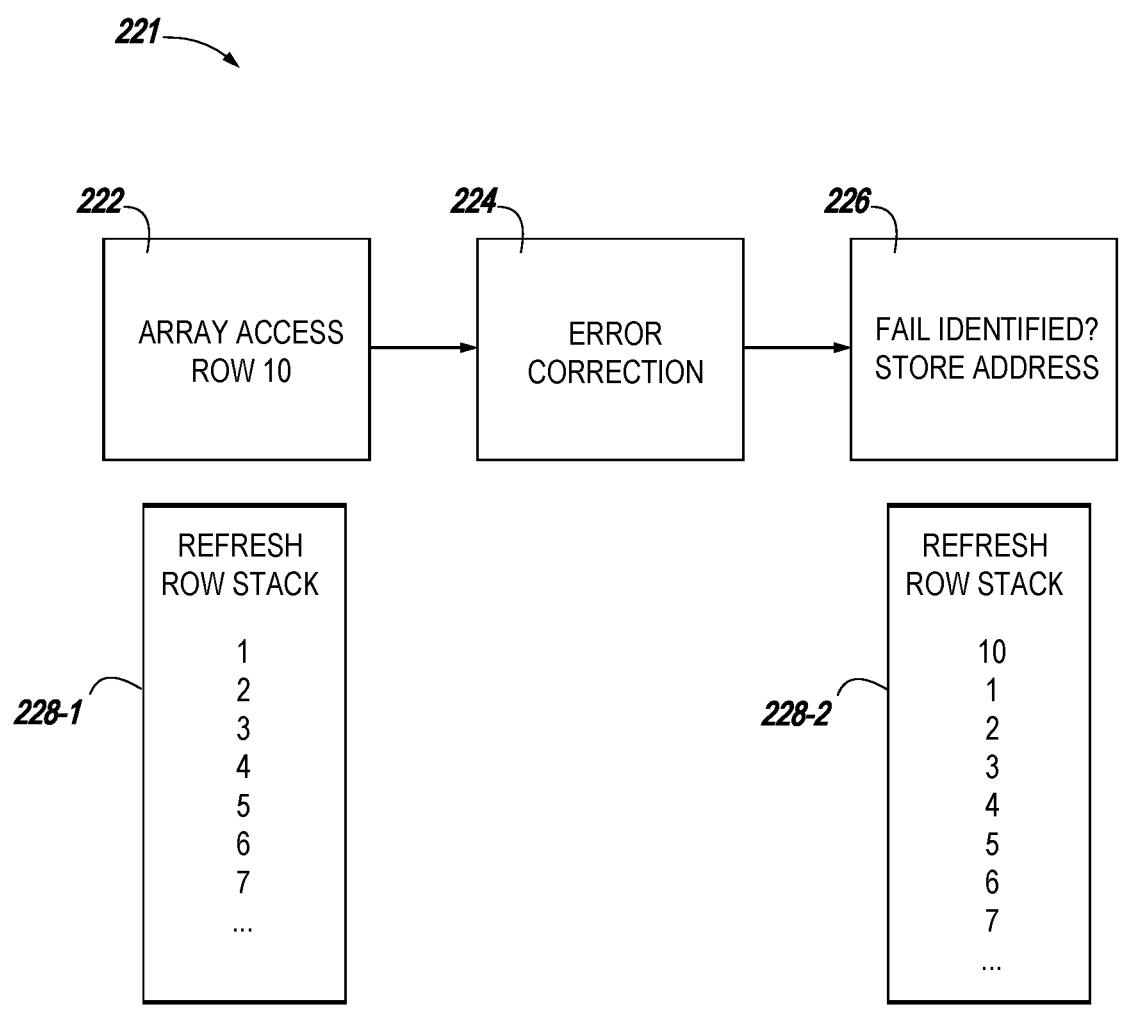
FIG. 2 is a flow diagram of a method for performing refresh operations in accordance with a number of embodiments of the present disclosure.

FIG. 2 is a flow diagram of a method 221 for performing refresh operations in accordance with a number of embodiments of the present disclosure. The method 221 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 221 is performed by the controller 123 in coordination with the ECC component 115. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 222, the method 221 can include accessing an array at an example row 10. As an example, a row 10 of the memory array, e.g., a tenth ($10^{th}$) row of memory cells, can be accessed. At block 224, an error correction operation can be performed on row 10. The error correction of row 10 can be performed by the ECC component 115 illustrated in FIG. 1. In response to row 10 including at least one error (e.g., one bit error), at block 226, a fail can be identified and an address associated with the address of row 10 can be stored in an additional row of the memory array (e.g., an additional row of error rows 147 in FIG. 1).

The stored row 10 can be used to perform a refresh operation on a row stack, indicated by "refresh row stack" lists 228-1 and 228-2. Refresh row stack 228-1 indicates a list of rows and their order for performing refresh operations prior to an error correction operation (e.g., error correction operation associated with block 224). As is illustrated, refresh row stack 228-1 indicates to perform refresh operations in the order of row "1," row "2," row "3," row "4," row "5," row "6," row "7," etc. In response to row 10 including an error (detected during the error correction operation at block 224), row "10" can be moved to the top of the refresh row stack list, resulting in refresh row stack 228-2 initially indicating to perform a refresh operation on row "10" first. In this way, row 10 can be refreshed more often than rows 1, 2, 3, 4, 5, 6, 7, etc.

While row 10 is described as being refreshed more frequently, examples are not so limited. For example, if more than one row, such as row 10 along with row 5, included a threshold quantity (or number) of errors, then row 10 and row 5 may be moved to a top of a refresh row stack list and would be refreshed more frequently than the other rows. Further, while row 10 is illustrated as being refreshed at the top of refresh row stack 228-2, examples are not so limited. Row 10 may be refreshed every $10^{th}$ refresh operation, every $50^{th}$ refresh operation, every $100^{th}$ refresh operation. The frequency with which row 10 is refreshed can be determined based on a quantity of errors of row 10 and/or a total number of rows to be refreshed overall.

Figure 3:
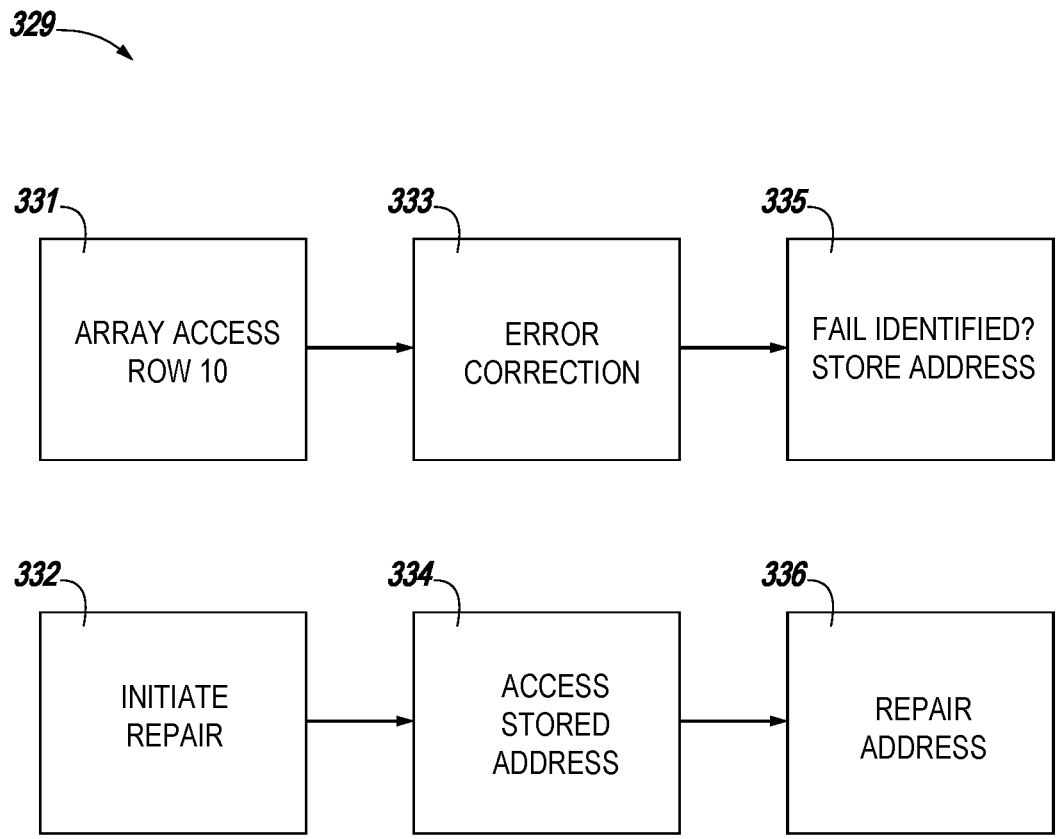
FIG. 3 is a flow diagram of a method for performing a repair operation on an address location in a memory device in accordance with a number of embodiments of the present disclosure.

FIG. 3 is a flow diagram of a method 329 for performing a repair operation on an address (or location) in a memory device in accordance with a number of embodiments of the present disclosure. In this example, the memory device is a DRAM device. The method 329 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 329 is performed by the controller 123 in coordination with the ECC component 115. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 331, the method 329 can include accessing an array at an example row 10. As an example, a row 10 of the memory array, e.g., a tenth ($10^{th}$) row of memory cells, can be accessed. At block 333, an error correction operation can be performed on row 10. The error correction of row 10 can be performed by the ECC component 115 illustrated in FIG. 1. In response to row 10 including at least one error (e.g., one bit error), at block 335, a fail can be identified and an address associated with the location of row 10 can be stored in an additional row of a memory device (e.g., an additional row of error rows 147 in memory device 120 of FIG. 1).

At block 332, a repair operation can be initiated. In one example, the repair operation can be initiated by a user. The user can send a message to the memory device to perform a repair operation. The address of which rows to perform the repair operation can be stored in the memory device and may not be sent by the user to the memory device. As an example, the user device (e.g., the host) may not store the address for rows to be repaired as the addresses will be stored in the memory device itself (e.g., at the "error rows" 147 of the memory device 120 illustrated in FIG. 1). In one example, a self-repair operation can be performed by the memory device to initiate the repair operation. With the self-repair operation, the memory device can initiate the repair operation in the absence of a message from a host. The self-repair operation can occur during normal operation of the memory device. The self-repair operation can occur in the absence of a self-test operation occurring on the memory device. In some examples, a self-repair operation can be a hidden soft-PPR (e.g., using latches) due to a time used for each type of repair and an ability to be able to hide the repair within the tRFC time period. This may be the only time that a memory device (e.g., a DRAM memory device) is in control of the operations during run-time operation. The tRFC time period can refer to a row refresh cycle timing. As an example, the tRFC can determine an amount of cycles to refresh a row on a memory bank. In some examples, if this is set too short, it can cause corruption of data and if it is too high, it can cause a loss of performance, but increased stability.

At block 334, the memory device, upon receiving the message to initiate the repair operation, can access the stored address. At block 336, the memory device can perform the repair operation on the rows at the addresses that are stored in the memory device.

Figure 4:
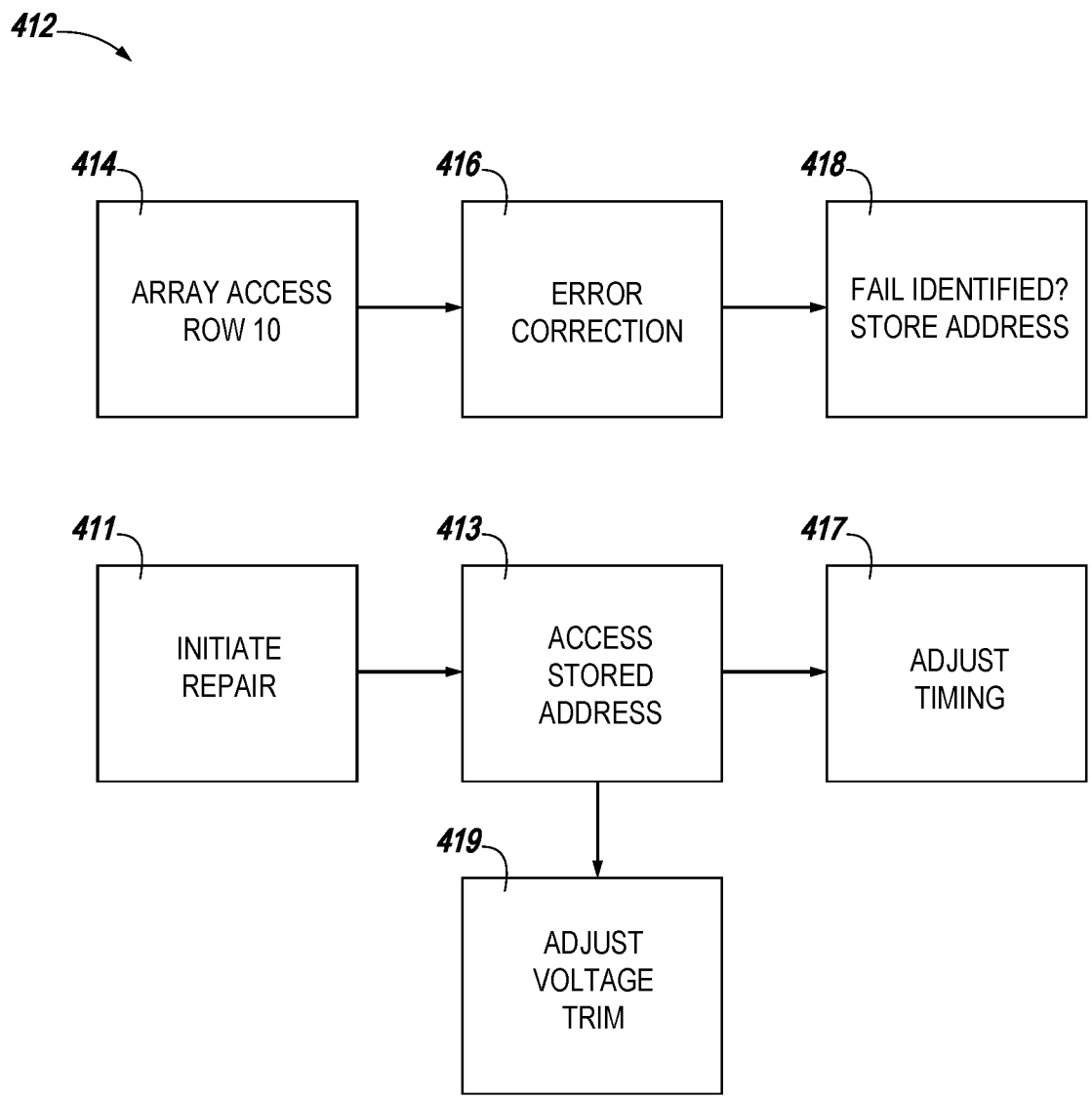
FIG. 4 is a flow diagram of a method for performing a repair operation on an address location in a memory device in accordance with a number of embodiments of the present disclosure.

FIG. 4 is a flow diagram of a method 412 for performing a repair operation on an address (or location) in a memory device in accordance with a number of embodiments of the present disclosure. In this example, the memory device is a DRAM device. The method 412 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 412 is performed by the controller 123 in coordination with the ECC component 115. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 414, the method 412 can include accessing an array of a memory device (e.g., such as memory device 120 in FIG. 1) at an example row 10. As an example, a row 10 of the memory array, e.g., a tenth ($10^{th}$) row of memory cells, can be accessed. At block 416, an error correction operation can be performed on row 10. The error correction of row 10 can be performed by the ECC component 115 illustrated in FIG. 1. In response to row 10 including at least one error (e.g., one bit error), at block 418, a fail can be identified and an address associated with the location of row 10 can be stored in an additional row of the memory device (e.g., an additional row of error rows 147 in FIG. 1).

At block 411, a repair operation can be initiated. In one example, the repair operation can be initiated by a user. The user can send a message to the memory device to perform a repair operation. The address of which rows to perform the repair operation can be stored in the memory device and may not be sent by the user to the memory device. As an example, the user device (e.g., the host) may not store the address for rows to be repaired as the addresses will be stored in the memory device itself (e.g., at the "error rows" 147 of the memory device 120 illustrated in FIG. 1). In one example, a self-repair operation can be performed by the memory device to initiate the repair operation. With the self-repair operation, the memory device can initiate the repair operation in the absence of a message from a host. The self-repair operation can occur during normal operation of the memory device. The self-repair operation can occur in the absence of a self-test operation occurring on the memory device.

At block 413, the memory device, upon receiving the message to initiate the repair operation, can access the stored address. In one example, at block 417, the memory device can adjust a timing of an access of a memory cell in a row at the address in order to alleviate the affects of the errors in the memory cell. In one example, at block 419, a voltage trim associated with a memory cell at the row address with the error can be adjusted.

Figure 5:
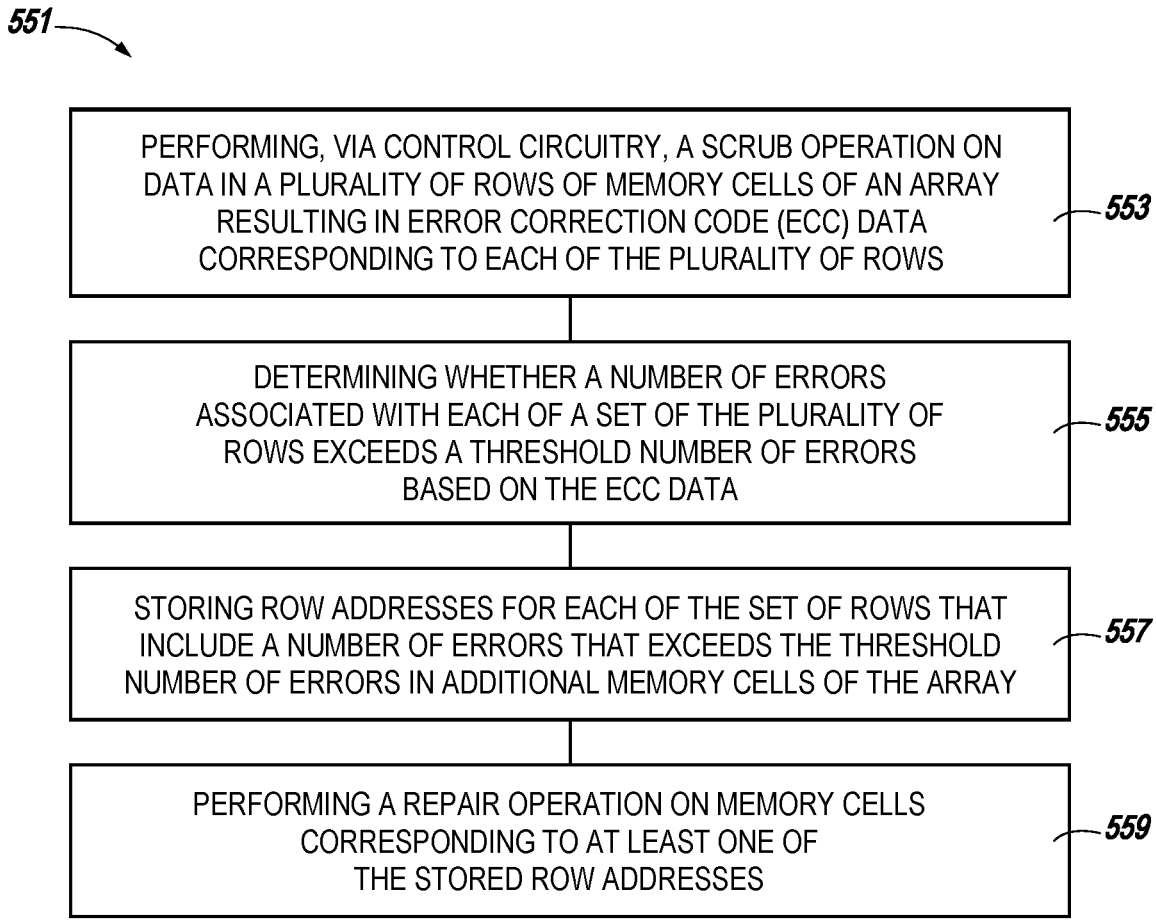
FIG. 5 is a flow diagram of a method for storing memory device on-die ECC data in accordance with embodiments of the present disclosure.

FIG. 5 is a flow diagram of a method 551 for storing memory device on-die ECC data in accordance with embodiments of the present disclosure. In this example, the memory device is a DRAM device. The method 551 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 551 is performed by the controller 123 in coordination with the ECC component 115. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 553, the method 551 can include performing, via control circuitry, a scrub operation on data in a plurality of rows of memory cells of an array resulting in error correction code (ECC) data corresponding to each of the plurality of rows. The rows of memory cells can be in a memory array, such as memory array 130 in FIG. 1. The scrub operation can refer to an operation where an ECC operation is performed on a set of memory cells in order to determine whether an error has occurred in the data stored in the set of memory cells and how many errors have occurred in that particular memory cell. In some examples, the scrub operation can refer to a read-modify-write operation through the full memory array where errors can be counted and corrected. An intelligent monitoring of a run-time ECC correction operation could serve as a substitute for a scrub operation when trying to determine an accumulation of errors on a row or rows for storing an address and initiating a repair process. The scrub operation can be performed by an error correction code (ECC) component, such as ECC component 115 in FIG. 1.

At block 555, a determination of whether a quantity (or number) of errors associated with each of a set of the plurality of rows exceeds a threshold quantity of errors based on the ECC data can be performed. As an example, a threshold quantity of errors can include two (2) errors and each of the plurality of rows that includes more than two errors can be identified. In some examples, the rows with at least or more than the threshold quantity of errors can be identified.

At block 557, row addresses can be stored for each of the set of rows that include a quantity of errors that exceeds the threshold quantity of errors in additional memory cells or registers of the memory device. The additional memory cells can be the "error rows" 147 of memory device 120 in FIG. 1. In some examples, an address associated with a row with the largest quantity of errors can be stored. In some examples, addresses of all rows that have a quantity of errors that are equal to or greater than a threshold quantity of errors can be stored.

At block 559, a repair operation can be performed on memory cells corresponding to at least one of the stored row addresses. The repair operation can include correcting the quantity of errors. In some examples, the repair operation can include altering a voltage of the cell associated with the address or altering a timing of access of the cell associated with the address.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
an array of memory cells;
control circuitry coupled to the array, wherein the control circuitry is configured to:
perform a scrub operation on a portion of data stored in the array that results in error correction code (ECC) data;
wherein the portion of data are stored in a plurality of rows of memory cells of the array and portions of the ECC data correspond to each of the plurality of rows;
determine that a set of the plurality of rows includes a number of errors that exceeds a threshold number of errors based on the ECC data;
store row addresses corresponding to the set of the plurality of rows;
receive a request from a host to perform a repair operation in response to at least one row address being stored, wherein the request does not include the stored row addresses; and
performing the repair operation on the set of the plurality of rows by accessing the stored row addresses.

2. The memory device of claim 1, wherein the control circuitry is further configured to cause a refresh operation on the set of the plurality of rows to occur more frequently than on a different set of the plurality of rows than the set of the plurality of rows by transferring row addresses associated with the set of the plurality of rows to a beginning of an ordered list of row addresses to perform the refresh operation.

3. The memory device of claim 2, wherein the control circuitry is configured to cause the refresh operation independent of an occurrence of a row hammer event on the set of the plurality of rows.

4. The memory device of claim 1, wherein the host is an external processor.

5. The memory device of claim 1, wherein the control circuitry is configured to receive the message without receiving from the host an indication of which rows of the plurality of rows on which to perform the repair operation.

6. The memory device of claim 1, wherein the control circuitry is configured to perform a self-repair operation using memory cells corresponding to the stored row addresses.

7. The memory device of claim 1, wherein the control circuitry is configured to determine that the set of the plurality of rows includes the number of errors that exceeds a threshold number of errors without performing a self-test operation.

8. The apparatus of claim 1, wherein the control circuitry is configured to alter a timing of an access or a voltage applied to at least one memory cell within the set of the plurality of rows based on the determination.

9. A method, comprising:
performing, via control circuitry, a scrub operation on data of a plurality of rows of memory cells of an array resulting in error correction code (ECC) data corresponding to each of the plurality of rows;
determining that a number of errors associated with the data exceeds a threshold number of errors based on the ECC data;
writing one or more bits that indicate row addresses associated with the data that exceeds the threshold number of errors in additional memory cells of the array;
receive a message from a host to perform a repair operation in response to at least one row address being stored, wherein the message does not include the one or more bits that indicates the row addresses; and
performing the repair operation on memory cells corresponding to at least one of the row addresses in response to receiving the message.

10. The method of claim 9, wherein the message does not include data associated with which row to perform the repair operation on.

11. The method of claim 9, wherein:
the row addresses associated with the written one or more bits are added to a beginning of a list for performing refresh operations; and
memory cells associated with the row addresses are refreshed at a greater frequency than memory cells not associated with the row addresses due to the one or more bits being added to the beginning.

12. The method of claim 9, wherein the row addresses comprise a row address associated with memory cells that include a number of errors greater than memory cells of other row addresses.

13. The method of claim 9, wherein the one or more bits are written to a plurality of rows of memory cells where each of the plurality of rows of memory cells comprises memory cells that include a number of error counts greater than a threshold number of error counts.

14. The method of claim 9, wherein the array is an array of dynamic random access memory (DRAM) cells.

15. A memory device, comprising:
an array of memory cells;
control circuitry coupled to the array, wherein the control circuitry is configured to:
generate error correction code (ECC) data from a scrub operation on a plurality of rows of memory cells of an array;
determine whether the ECC data indicates that an error count associated with a particular row of memory cells exceeds a threshold error count;
in response to the error count associated with the particular row exceeding the threshold error count, logging an address of the particular row in the array;
receiving a message from a host to perform a repair operation in response to at least one row address being stored, wherein the message does not include the one or more bits that indicates the row addresses; and
performing the repair operation on memory cells corresponding to the at least one row address in response to receiving the message.

16. The memory device of claim 15, wherein the control circuitry is further configured to alter a voltage applied to at least one of the memory cells in the particular row in response to the error count exceeding the threshold error count.

17. The memory device of claim 15, wherein the controller is further configured to store addresses of rows associated with error counts that exceed the threshold error count in a non-volatile memory and retrieve the addresses subsequent to a power failure or a power cycling event.

18. The memory device of claim 15, wherein the controller is further configured to:
refresh a first set of memory cells of rows associated with error counts that exceed the threshold error count more frequently than a second set of memory cells of rows associated with error counts that are less than the threshold error count; and
in response to a power failure or restart, refresh the first set of memory cells at a same frequency as the second set of memory cells.

19. The memory device of claim 15, wherein the controller is configured to:
retrieve the addresses of the rows of memory cells associated with error counts that exceed the threshold error count prior to performing the repair operation on the memory cells at the retrieved addresses.

* * * * *

UNITED STATES PATENT AND TRADEMARK OFFICE
CERTIFICATE OF CORRECTION

| | |
|---|---|
| PATENT NO. | : 11,664,084 B2 |
| APPLICATION NO. | : 17/391830 |
| DATED | : May 30, 2023 |
| INVENTOR(S) | : Anthony D. Veches et al. |

It is certified that error appears in the above-identified patent and that said Letters Patent is hereby corrected as shown below:

In the Claims

In Column 10, Line 34, in Claim 1, "performing the repair operation" should read "perform the repair operation".

In Column 11, Line 13, in Claim 9, "receive a message" should read "receiving a message".

In Column 12, Line 11, in Claim 15, "receiving a message" should read "receive a message".

In Column 12, Line 16, in Claim 15, "performing the repair operation" should read "perform the repair operation".

Signed and Sealed this
Sixteenth Day of July, 2024

Katherine Kelly Vidal
*Director of the United States Patent and Trademark Office*